US011355542B2

(12) United States Patent
Sato (10) Patent No.: US 11,355,542 B2
(45) Date of Patent: Jun. 7, 2022

(54) LINEAR TYPE SOLID-STATE IMAGING DEVICE

(71) Applicants: Kabushiki Kaisha Toshiba, Tokyo (JP); Toshiba Electronic Devices & Storage Corporation, Tokyo (JP)

(72) Inventor: Yoshihiro Sato, Sagamihara Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 148 days.

(21) Appl. No.: 16/739,579

(22) Filed: Jan. 10, 2020

(65) Prior Publication Data

US 2021/0066365 A1    Mar. 4, 2021

(30) Foreign Application Priority Data

Aug. 29, 2019 (JP) ............................. JP2019-156955

(51) Int. Cl.
    *H01L 27/146*         (2006.01)

(52) U.S. Cl.
    CPC .... *H01L 27/14623* (2013.01); *H01L 27/1461* (2013.01); *H01L 27/14603* (2013.01);
(Continued)

(58) Field of Classification Search
    CPC ......... H01L 27/14643; H01L 27/14623; H01L 27/14636; H01L 27/1463;
(Continued)

(56) References Cited

U.S. PATENT DOCUMENTS

| 6,653,617 B2 | 11/2003 | Hiyama et al. |
| 2016/0211296 A1 | 7/2016 | Kobayashi et al. |

(Continued)

FOREIGN PATENT DOCUMENTS

| JP | 3647397 B2 | 5/2005 |
| JP | 2010245499 A | 10/2010 |

(Continued)

OTHER PUBLICATIONS

Machine Translation of JP 2015/088693-A (Kikuchi Yoshiaki), Japan (Year: 2015).*

*Primary Examiner* — Scott B Geyer (74) *Attorney, Agent, or Firm* — Allen & Overy LLP (57) ABSTRACT

A solid-state imaging device includes a semiconductor layer, an insulating layer, a plurality of photodetection elements, a transistor, and a metal member. The insulating layer is provided on the semiconductor layer. The photodetection elements are provided in the semiconductor layer, and arranged in a line. The photodetection elements generate charges at light incidence. The transistor is provided in an amplifier circuit. The amplifier circuit is provided in the semiconductor layer and the insulating layer, is isolated from the photodetection elements, and amplifies electrical signals due to the charges. The metal member is disposed between a photodetection area and the transistor in a plan view. The photodetection area is provided with the photodetection elements.

9 Claims, 10 Drawing Sheets

(52) U.S. Cl.
CPC .. *H01L 27/14612* (2013.01); *H01L 27/14636* (2013.01); *H01L 27/14643* (2013.01)

(58) Field of Classification Search
CPC ......... H01L 27/14603–14607; H01L 27/1461; H01L 27/14609–14616; H01L 27/14625; H01L 27/14629
See application file for complete search history.

(56) References Cited

U.S. PATENT DOCUMENTS

| | | | |
|---|---|---|---|
| 2017/0287961 A1* | 10/2017 | Kobayashi | ........ H01L 27/14629 |
| 2019/0051691 A1* | 2/2019 | Hayashi | ............ H01L 27/14636 |
| 2020/0119073 A1* | 4/2020 | Machida | ........... H01L 27/14625 |
| 2020/0279876 A1* | 9/2020 | Lee | ................... H01L 27/14645 |

FOREIGN PATENT DOCUMENTS

| | | | | | |
|---|---|---|---|---|---|
| JP | 2015088693 A | * | 5/2015 | ....... | H01L 29/42392 |
| WO | 2015-068589 A1 | | 3/2017 | | |

* cited by examiner

LINEAR TYPE SOLID-STATE IMAGING DEVICE

CROSS-REFERENCE TO RELATED APPLICATIONS

This application is based upon and claims the benefit of priority from Japanese Patent Application No. 2019-156955, filed on Aug. 29, 2019; the entire contents of which are incorporated herein by reference.

FIELD

Embodiments described herein relate generally to a solid-state imaging device.

BACKGROUND

In a solid-state imaging device, light incident on an imaging element such as a photodiode is converted into electric charge, and after this electric charge is converted into an electrical signal, an amplifier circuit amplifies and outputs the electrical signal. At this time, the transistor in the amplifier circuit inevitably emits light, but noise may be generated when this light enters the imaging element. In order to reduce such noise, the amplifier circuit is provided at a position away from the imaging element.

DETAILED DESCRIPTION

According to one embodiment, a solid-state imaging device includes a semiconductor layer, an insulating layer, a plurality of photodetection elements, a transistor, and a metal member. The insulating layer is provided on the semiconductor layer. The photodetection elements are provided in the semiconductor layer, and arranged in a line. The photodetection elements generate charges at light incidence. The transistor is provided in an amplifier circuit. The amplifier circuit is provided in the semiconductor layer and the insulating layer, is isolated from the photodetection elements, and amplifies electrical signals due to the charges. The metal member is disposed between a photodetection area and the transistor in a plan view. The photodetection area is provided with the photodetection elements.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions. In the specification and drawings, components similar to those described previously or illustrated in an antecedent drawing are marked with like reference numerals, and a detailed description is omitted as appropriate.

First Embodiment

Figure 1A:
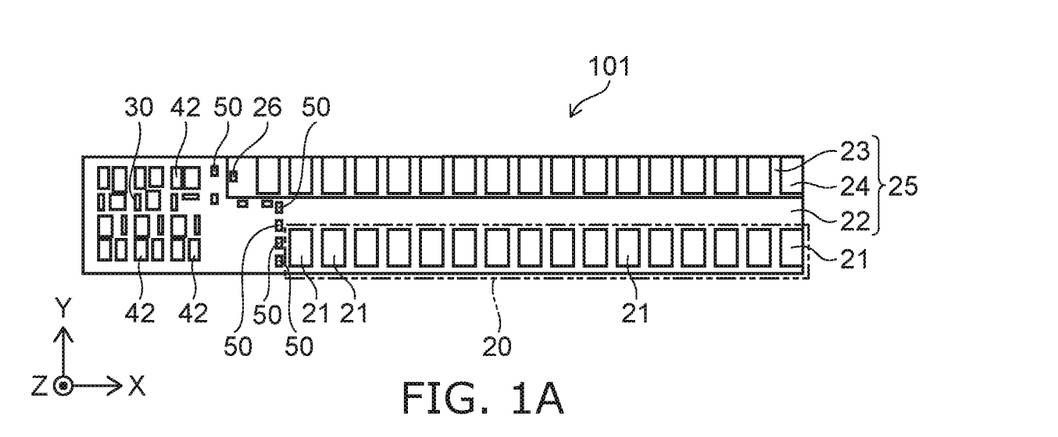
FIG. 1A is a plan view showing a solid-state imaging device according to a first embodiment.
Figure 1B:
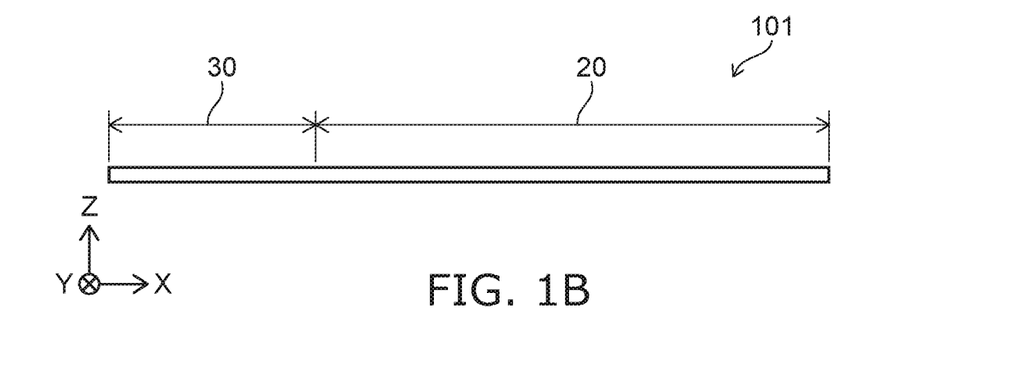
FIG. 1B is a front view showing the solid-state imaging device according to the first embodiment.
Figure 2:
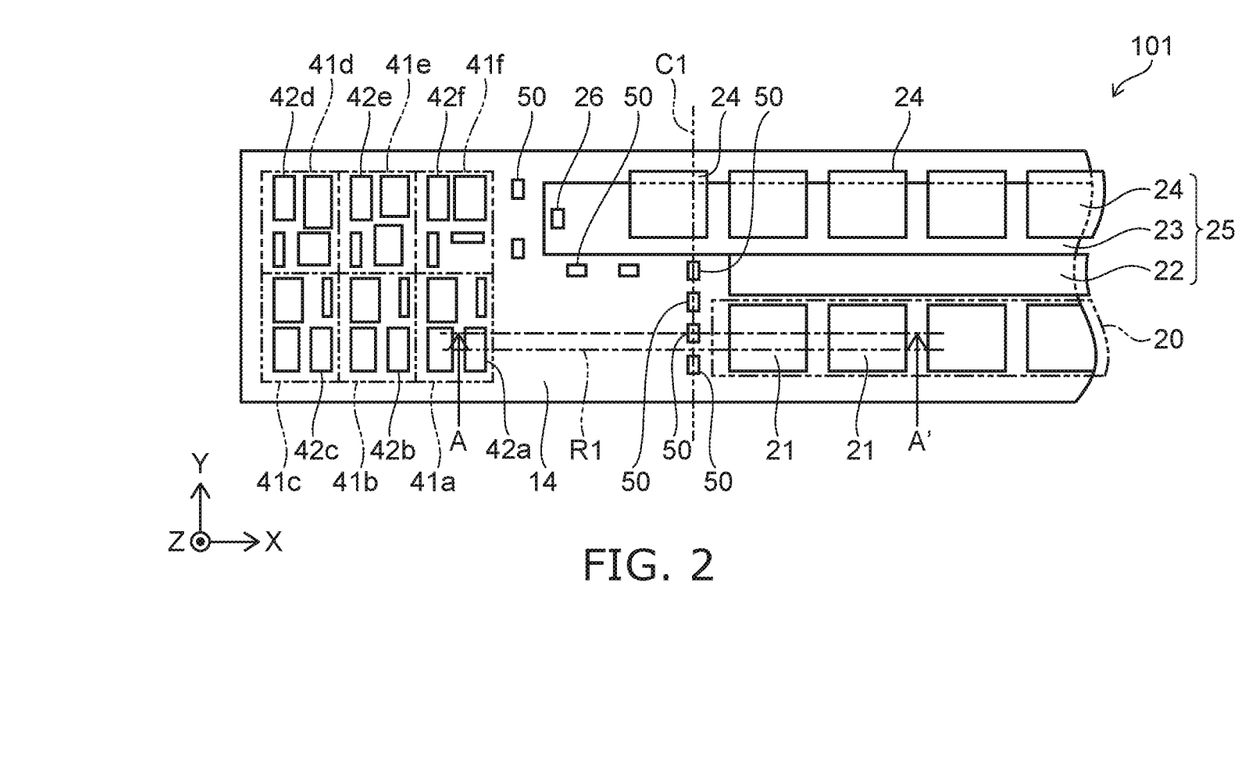
FIG. 2 is an enlarged plan view of FIG. 1A.
Figure 3:
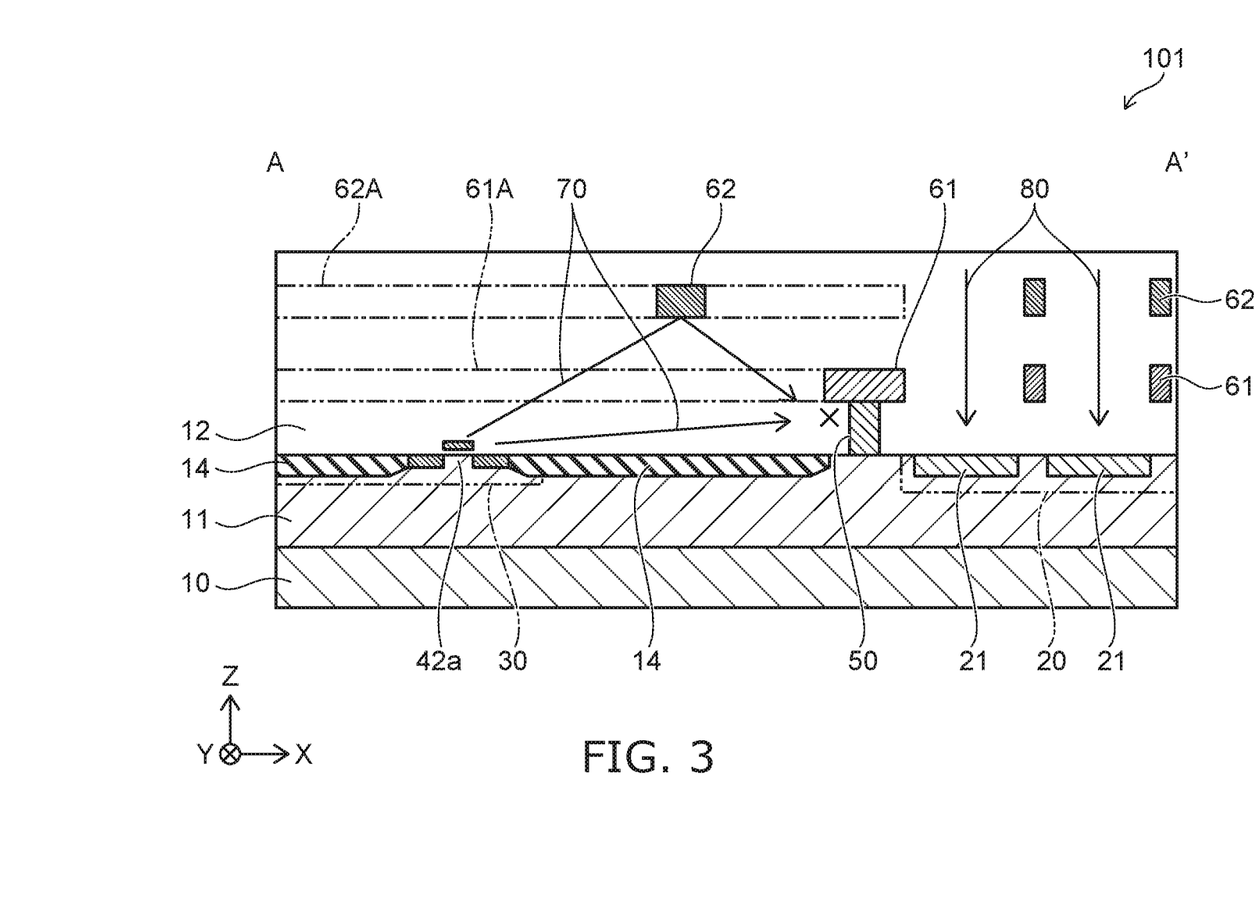
FIG. 3 is a cross sectional view along A-A' line shown in FIG. 2.
Figure 4:
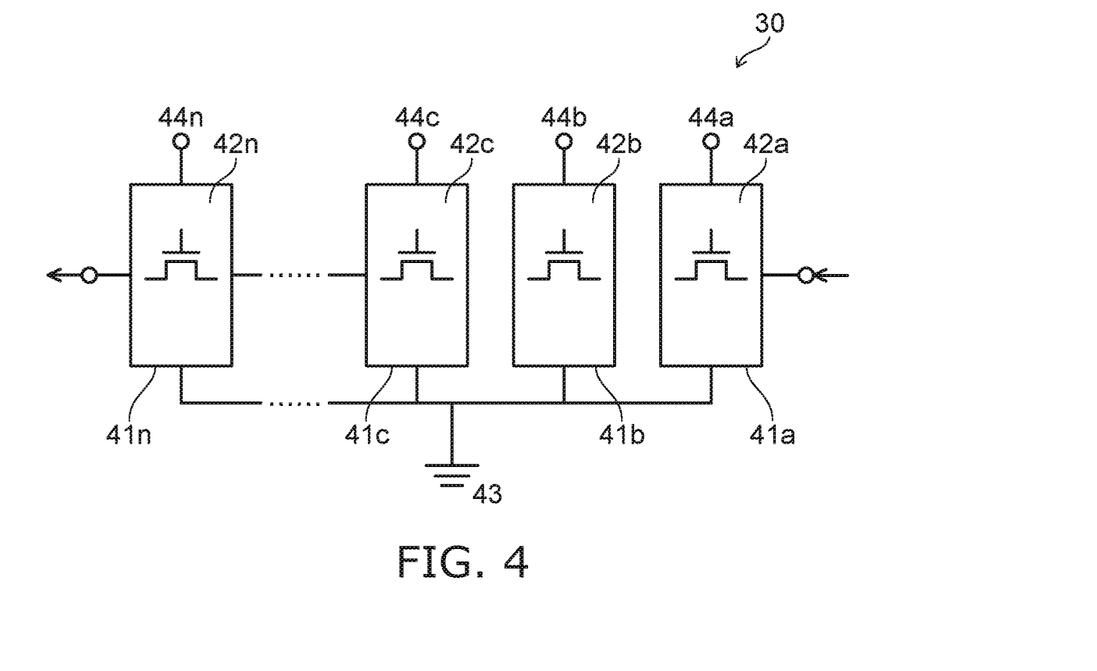
FIG. 4 is a circuit diagram showing an amplifier circuit of the solid-state imaging device according to the first embodiment.

FIG. 1A is a plan view showing a solid-state imaging device 101 according to a first embodiment. FIG. 1B is a front view showing the solid-state imaging device 101 according to the first embodiment. FIG. 2 is an enlarged plan view showing the solid-state imaging device 101 according to the first embodiment. In FIG. 2, a first interconnect 61 and a second interconnect 62 are omitted. FIG. 3 is a cross sectional view along A-A' line shown in FIG. 2. FIG. 4 is a circuit diagram showing an amplifier circuit of the solid-state imaging device 101.

The solid-state imaging device 101 of the embodiment is used for an image capture unit (not shown) such as a scanner, for example. The rod-shaped image capture unit includes multiple solid-state imaging devices 101 arranged in a straight line and a light source, moves in one direction from one end to the other end on the lower surface of the transparent stage of the scanner, and captures the image of the object to be placed on the upper surface of the stage.

As shown in FIGS. 1A and 1B, FIG. 2, and FIG. 3, the solid-state imaging device 101 of the embodiment are provided with, for example, an n-type semiconductor layer 10, for example, p-type semiconductor layer 11 provided on the semiconductor layer 10, and an insulating layer 12 provided on the semiconductor layer 11. A circuit, elements, interconnects and the like are formed in the semiconductor layer 11 and the insulating layer 12. The insulating layer 12 has insulating properties and translucency, and includes, for example, silicon oxide.

The overall shape of the solid-state imaging device 101 is an elongated rectangular shape. Hereinafter, for convenience of description, an XYZ orthogonal coordinate system is adopted in the specification. The longitudinal direction of the solid-state imaging device 101 is "X-direction", the short direction is "Y-direction", and the thickness direction, that is, the arrangement direction of the semiconductor layer 10, the semiconductor layer 11, and the insulating layer 12 is "Z-direction". In the Z-direction, the direction from the semiconductor layer 10 toward the insulating layer 12 is also referred to as "up", and the opposite direction is also referred to as "down", for convenience. The direction of gravity is unrelated to the directions.

In the solid-state imaging device 101, an amplifier circuit 30 is formed atone end in the X-direction. In the area other than the amplifier circuit 30 in the solid-state imaging device 101, a photodetection area 20 is formed on one side in the Y-direction, and a charge transfer path 25 is formed on the other side in the Y-direction. Both the photodetection area 20 and the charge transfer path 25 extend in the X-direction.

In the photodetection area 20, for example, multiple photodetection elements 21 such as photodiodes are arranged side by side in the X-direction. As shown in FIG. 3, the photodetection elements 21 are formed in the upper layer portion of the semiconductor layer 11 so as to be separated from each other, and convert light 80 incident from above into charges.

The charge transfer path 25 includes a long-shaped impurity layer for transfer 23 formed in an upper layer portion of the semiconductor layer 11 and disposed in parallel to be isolated from the photodetection area 20; a readout gate electrode 22 provided directly on a region between the photodetection area 20 and the impurity layer for transfer 23 in the insulating layer 12; and multiple gate electrodes for transfer 24 provided directly on the impurity layer for transfer 23 in the insulating layer 12 to correspond to multiple photodetection elements 21. The impurity layer for transfer 23 is longer in the X-direction than the photodetection area 20, extends from the photodetection area 20 toward the amplifier circuit 30, and is provided to be isolated from the amplifier circuit 30. A charge detector 26 is provided at one end of the impurity layer for transfer 23, the one end is a tip of the impurity layer for transfer 23 extending toward the amplifier circuit 30. The charge detector 26 is connected to the amplifier circuit 30. That is, the direction from the photodetection area 20 toward the impurity layer for transfer 23 (Y-direction) intersects the direction from the photodetection area 20 toward the amplifier circuit 30 (X-direction). Further, the distance between the impurity layer for transfer 23 and the amplifier circuit 30 is shorter than the distance between the photodetection area 20 and the amplifier circuit 30.

As shown in FIG. 2 and FIG. 4, the amplifier circuit 30 is provided to be isolated from the photodetection area 20 and the charge transfer path 25 in the X-direction. The amplifier circuit 30 includes multiple amplifying elements 41a, 41b, . . . , 41n (hereinafter, also collectively referred to as "amplifying elements 41") provided in the semiconductor layer 11. The multiple amplifying elements 41 are formed in the semiconductor layer 11 and the insulating layer 12.

On the semiconductor layer 11, an STI (Shallow Trench Isolation: element isolation insulating film) 14 is provided between the amplifier circuit 30 and the photodetection area 20 to electrically partition them.

In the insulating layer 12, multiple first interconnects 61 (hereinafter, also simply referred to as "interconnects 61") and multiple second interconnects 62 (hereinafter, also simply referred to as "interconnects 62") are particularly concentrated and stretched around above the amplifier circuit 30. In FIG. 2, complicated interconnects 61 and interconnects 62 are omitted, and only a first interconnect area 61A and a second interconnect area 62A are shown, the first interconnect area 61 is the area where the first interconnects 61 are provided and the second interconnects area 62A is the area where the second interconnects 62 are provided.

The first interconnects 61 are stretched around at the same height. The second interconnects 62 are stretched around at the same height above the first interconnects 61. The interconnects 61, 62 are appropriately connected to each component such as the photodetection element 21, the charge transfer path 25, and the amplifier circuit 30.

In the embodiment, as shown in FIG. 2 and FIG. 3, multiple metal members 50 are disposed between the photodetection area 20 and the amplifier circuit 30. More specifically, the metal members 50 are disposed between the photodetection area 20 and a transistor 42 in a plan view. The metal members 50 are adjacent to the amplifier circuit 30 via the STI 14. For example, the multiple metal members 50 are provided side by side along a C1 line that intersects an R1 line that connects a transistor 42a to the photodetection area 20 with the shortest distance in a plan view, the R1 line connects a transistor 42a provided in the first stage of the amplifier circuit 30 and easily emitting the strongest light.

The metal members 50 are provided between the semiconductor layer 11 and the first interconnects 61 in the insulating layer 12. Each metal member 50 has a shape extending upward, and has a lower end disposed on the semiconductor layer 11 and connected to the semiconductor layer 11, and an upper end connected to the lower surface of the first interconnect 61. The metal member 50 has a columnar shape whose longitudinal direction is the Z-direction, and is, for example, a cylindrical shape, a quadrangular prism shape, or a quadrangular prism shape with rounded corners. For example, the metal member 50 functions as a contact that electrically connects the interconnect 61 to the semiconductor layer 11.

The metal member 50 may not be in contact with the semiconductor layer 11, and may be provided in a state where a portion thereof is embedded in the insulating layer 12. The metal member 50 includes, for example, tungsten of the same material as the interconnects 61, 62. Tungsten has a high specific gravity and good embeddability.

Next, the operation of the solid-state imaging device 101 according to the embodiment will be described.

Figure 6A:
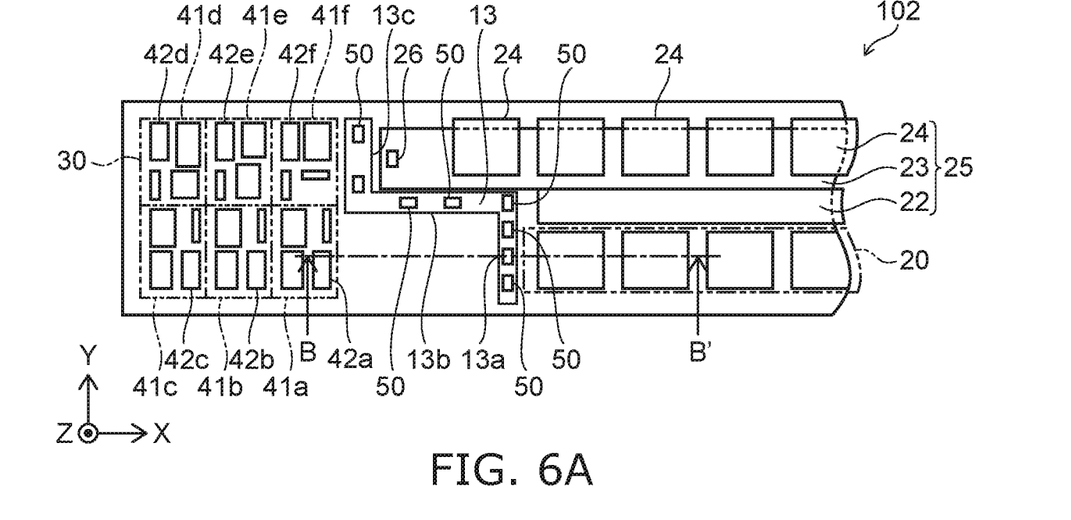
FIG. 6A is an enlarged plan view showing a solid-state imaging device according to a second embodiment.

As shown in FIG. 2, when the light 80 is incident on the photodetection element 21 through the insulating layer 12 from above, an electric charge is formed in the photodetection element 21. When a voltage is applied to the readout gate electrode 22, the charges generated by the multiple photodetection elements 21 are transferred to the impurity layer for transfer 23 provided along the X-direction. Each of the gate electrodes for transfer 24 is provided corresponding to each of the multiple photodetection elements 21. When a voltage is applied to the multiple gate electrodes for transfer 24, each gate electrode for transfer 24 transfers the charge in each impurity layer for transfer 23 to the next impurity layer for transfer 23 disposed on the amplifier circuit 30 side. In FIG. 6A, each charge carried from right to left arrives at the charge detector 26 one after another and is transferred from the charge detector 26 to the amplifier circuit 30.

The amplifier circuit 30 receives the charge carried by the charge transfer path 25 via the charge detector 26, converts the charge into an electrical signal, and amplifies the electrical signal by the multistage amplifying elements 41a, 41b, . . . , 41n. The multiple amplifying elements 41a, 41b, . . . , 41n include transistors 42a, 42b, . . . , 42n (hereinafter, also collectively referred to as "transistors 42") respectively, and amplify the fine electrical signal in a multistage manner by power supply voltages supplied via multiple power terminals 44a, 44b, . . . , 44n (hereinafter, also collectively referred to as "power terminals 44"). A voltage of, for example, 10 V is applied to the amplifier circuit 30, and light is emitted as the transistors 42 operate. Since the amount of light emission depends on the amount of current, for example, the transistor 42a of the first amplifying element 41a that amplifies the fine electrical signal converted from a charge into a signal tends to emit light strongly and to generate strong unnecessary light 70.

As shown in FIG. 3, since the photodetection element 21 converts the light 80 incident from above into charges, it is preferable to avoid incidence of the unnecessary light 70 as much as possible. The metal members 50 can block the progress of the unnecessary light 70, and can attenuate the unnecessary light 70 by reflecting it toward the amplifier circuit 30.

Next, the effect of the embodiment will be described.

In the solid-state imaging device 101, since the metal member 50 is provided, noise caused by the unnecessary light 70 can be suppressed even if the distance between the amplifier circuit 30 and the photodetection area 20 is shortened. Therefore, the solid-state imaging device 101 can be reduced in size. Since the metal member 50 can be formed at the same time as the contact provided in the amplifier circuit 30 or the like, the metal member 50 can be provided without increasing the dedicated process for providing the metal member 50.

If it is not necessary to use the metal member 50 as a contact or the like, the first interconnect 61 may not be disposed on the metal member 50, and the metal member 50 and the first interconnect 61 may not be connected. The structure in which the lower surface of the first interconnect 61 protruding to the transistor 42a side from the metal member 50 and the upper end of the metal member 50 are connected to each other makes it possible to easily reflect the unnecessary light 70 toward the transistor 42a and to return the unnecessary light 70.

Figure 5:
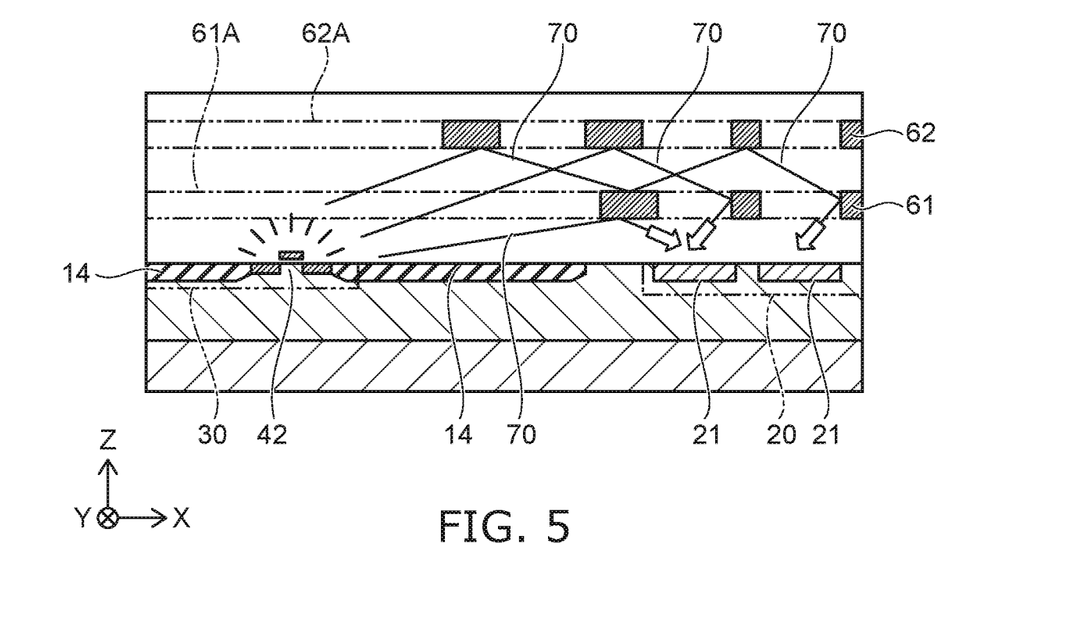
FIG. 5 is a cross sectional view showing a solid-state imaging device according to a comparative example.

FIG. 5 is a cross-sectional view showing a solid-state imaging device according to a comparative example when there is no metal member 50. There is a fear that the unnecessary light 70 generated by the light emission of the transistors 42 passes through the insulating layer 12, is mainly reflected by multiple metal interconnects 61 and 62 that extend around above the amplifier circuit 30, and enters the adjacent photodetection element 21. In particular, the unnecessary light 70 is likely to be incident on the photodetection element 21 closest to the amplifier circuit 30, and as a result, white streaks occur in the dark as a whole in the scanner. Further, the unnecessary light 70 enters in the dark as described above, thereby increasing the power consumption.

Second Embodiment

Figure 6B:
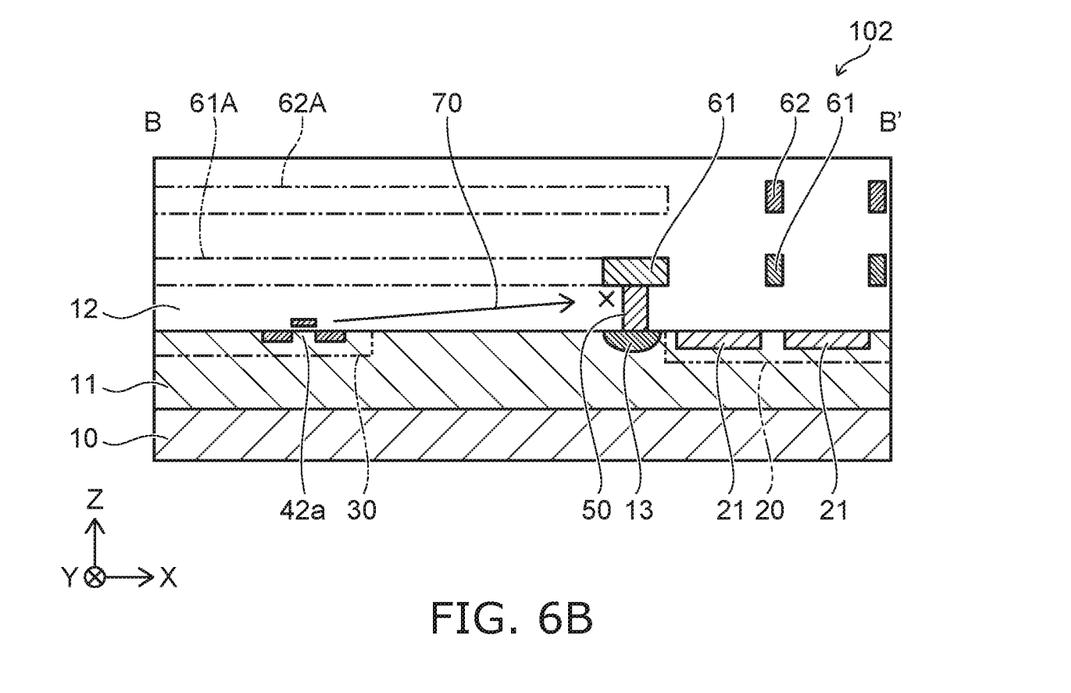
FIG. 6B is a cross sectional view along B-B' line shown in FIG. 6A.

FIG. 6A is an enlarged plan view showing a solid-state imaging device 102 according to a second embodiment. FIG. 6B is a cross sectional view along B-B' line of FIG. 6A. The first interconnect 61 and the second interconnect 62 are omitted in FIG. 6A.

As shown in FIG. 6A and FIG. 0.6B, in the embodiment, a high concentration area 13 is provided in the upper layer portion of the semiconductor layer 11. The impurity concentration of the high concentration area 13 is higher than the impurity concentration of the area in the semiconductor layer 11 excluding the high concentration area 13. The high concentration area 13 is provided between the photodetection area 20 and the amplifier circuit 30 and between the charge transfer path 25, in particular, the impurity layer for transfer 23 and the amplifier circuit 30. The high concentration area 13 has a crank-shape in a plan view, the crank shape including a portion 13a extending in the Y-direction along outer edges of the photodetection area 20 and the readout gate electrode 22 on the amplifier circuit 30 side, and a portion 13b extending in the X-direction along an outer edge of the impurity layer for transfer 23 on the photodetection area 20 side, the impurity layer for transfer 23 extending to the amplifier circuit 30 side, and a portion 13c extending in the Y-direction along an outer edge of one end of the extended impurity layer for transfer 23.

The metal member 50 is provided on the high concentration area 13 in the insulating layer 12 and is connected to the high concentration area 13. The metal member 50 is also connected to the first interconnect 61 disposed above. By connecting the metal member 50 to the semiconductor layer 11 via the high concentration area 13, a power supply potential or a ground potential can be efficiently applied to the semiconductor layer 11. The unnecessary light 70 can be blocked by the first interconnect 61 and the metal member 50.

Configurations, operations, and effects other than those described above in the embodiment are the same as those in the first embodiment.

Third Embodiment

Figure 7:
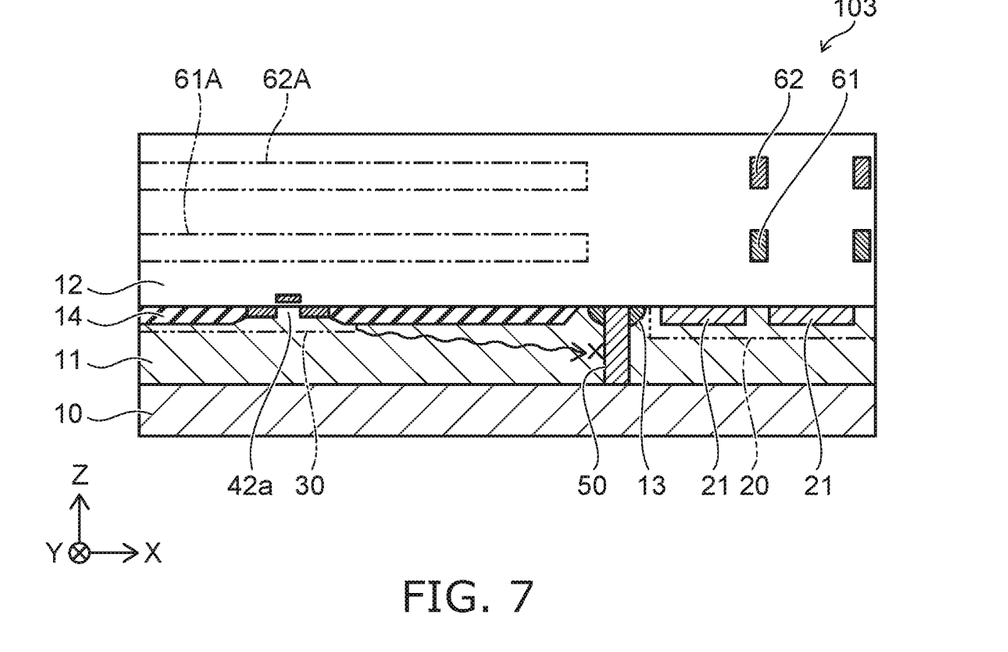
FIG. 7 is a cross sectional view showing a solid-state imaging device according to a third embodiment.

FIG. 7 is an enlarged cross sectional view showing a solid-state imaging device 103 according to a third embodiment.

As shown in FIG. 7, also in the embodiment, the high concentration area 13 is provided in the upper layer portion of the semiconductor layer 11. In a plan view, the high concentration area 13 has a crank shape similarly to the second embodiment.

The metal member 50 is provided so as to be buried in the high concentration area 13 and the semiconductor layer 11. In the embodiment, the metal member 50 is not provided in the insulating layer 12.

Since the semiconductor layer 11 also transmits light, the metal member 50 can attenuate the unnecessary light 70 by blocking and reflecting the unnecessary light 70 traveling in the semiconductor layer 11. Even if the metal member 50 is directly buried in the semiconductor layer 11 without providing the high concentration area 13, the same effect is brought about. The metal member 50 provided in the insulating layer 12 and connected to the interconnects 61, 62 may be extended downward and embedded in the semiconductor layer 11. Configurations, operations, and effects other than those described above in the embodiment are the same as those in the first embodiment.

Fourth Embodiment

Figure 8:
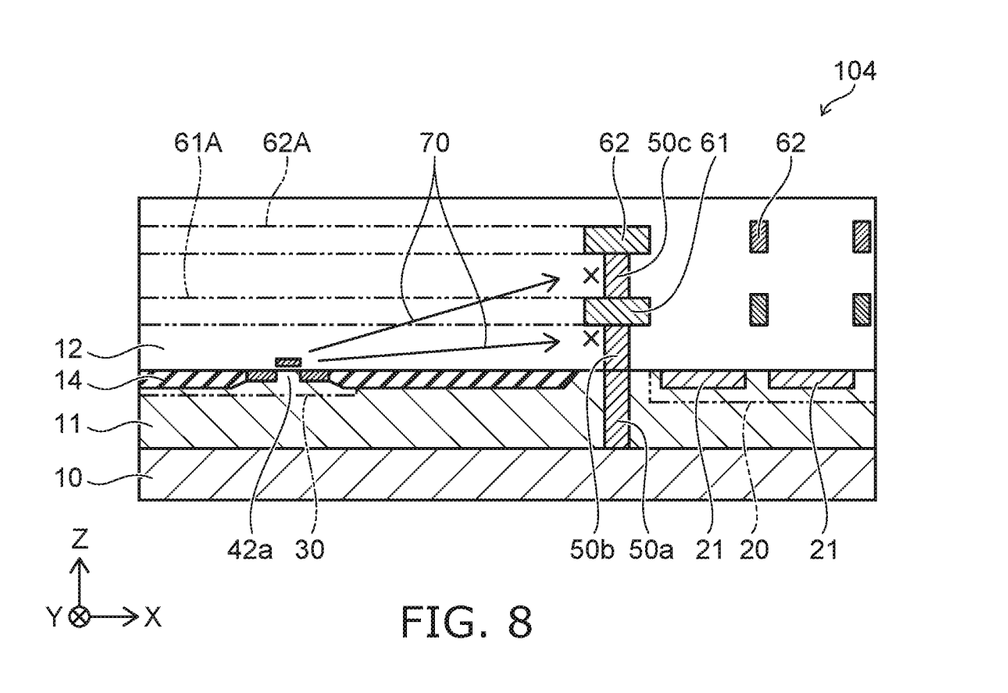
FIG. 8 is a cross sectional view showing a solid-state imaging device according to a fourth embodiment.

FIG. 8 is an enlarged cross sectional view showing a solid-state imaging device 104 according to a fourth embodiment.

As shown in FIG. 8, in the solid-state imaging device 104 according to the embodiment, multiple metal members 50a, 50b, and 50c are provided. The first interconnect 61, the second interconnect 62, and the multiple metal members 50a, 50b, and 50c are disposed so as to overlap in the Z-direction between the photodetection area 20 and the light emitting transistor 42a.

The first metal member 50a, the second metal member 50b, and the third metal member 50c have shapes extending in the Z-direction. The first metal member 50a is provided so as to be embedded in the semiconductor layer 11. The second metal member 50b is disposed on the first metal member 50a, and the upper end of the first metal member 50a and the lower end of the second metal member 50b are connected. The second metal member 50b is provided between the semiconductor layer 11 and the first interconnect 61 in the insulating layer 12, and connects the semiconductor layer 11 and the first interconnect 61.

The third metal member 50c is disposed on the second metal member 50b and the first interconnect 61. The lower end of the third metal member 50c is connected to the upper surface of the first interconnect 61. The third metal member 50c is provided between the first interconnect 61 and the second interconnect 62 that overlap in the insulating layer 12. The upper end of the third metal member 50c is connected to the lower surface of the second interconnect 62.

The first interconnect 61 and the second interconnect 62 are electrically connected to the semiconductor layer 11 via the metal members 50b and 50c.

The metal members 50a and 50b, the first interconnect 61, and the second interconnect 62 are able to block, reflect and return to the transistor side the unnecessary light 70 over the entire area in the Z-direction where the metal members 50a, 50b, 50c are provided, the unnecessary light 70 travels while being reflected between the semiconductor layer 11 and the second interconnect area 62A covering the top of the amplifier circuit 30.

In the embodiment, the metal members 50a, 50b, and 50c are provided so as to overlap with each other in a plan view, but may be displaced. For example, the metal member 50a embedded in the semiconductor layer 11 may be shifted from the photodetection area 20 side or the transistor 42a side. Preferably, if the metal members 50a and 50b are shifted in a range overlapping each other, the metal members 50a and 50b can easily block and prevent to leak the unnecessary light 70 in the Z-direction. As long as the second metal member 50b overlaps the first interconnect 61, the second metal member 50b may be shifted to the photodetection area 20 side or the transistor side 42a side, for example. In a range where the first interconnect 61 and the second interconnect 62 overlap each other, the third metal member 50c may be shifted from the photodetection area 20 side or the transistor 42a side, for example.

The metal member 50b connected to the semiconductor layer 11 and the metal member 50c buried in the semiconductor layer 11 may be integrally formed. Any of the metal members 50a, 50b, and 50c may be omitted.

According to the embodiment, the metal members 50a, 50b, 50c, the first interconnect 61, and the second interconnect 62 are continuously disposed in the Z-direction between the inside of the semiconductor layer 11 and the second interconnect 62. Accordingly, the unnecessary light 70 diffused in the Z-direction can be effectively blocked, reflected, and weakened, so that the distance between the amplifier circuit 30 and the photodetection area 20 can be further reduced, and the solid-state imaging device 104 can be reduced in size.

Configurations, operations, and effects other than those described above in the embodiment are the same as those in the first embodiment.

Fifth Embodiment

Figure 9:
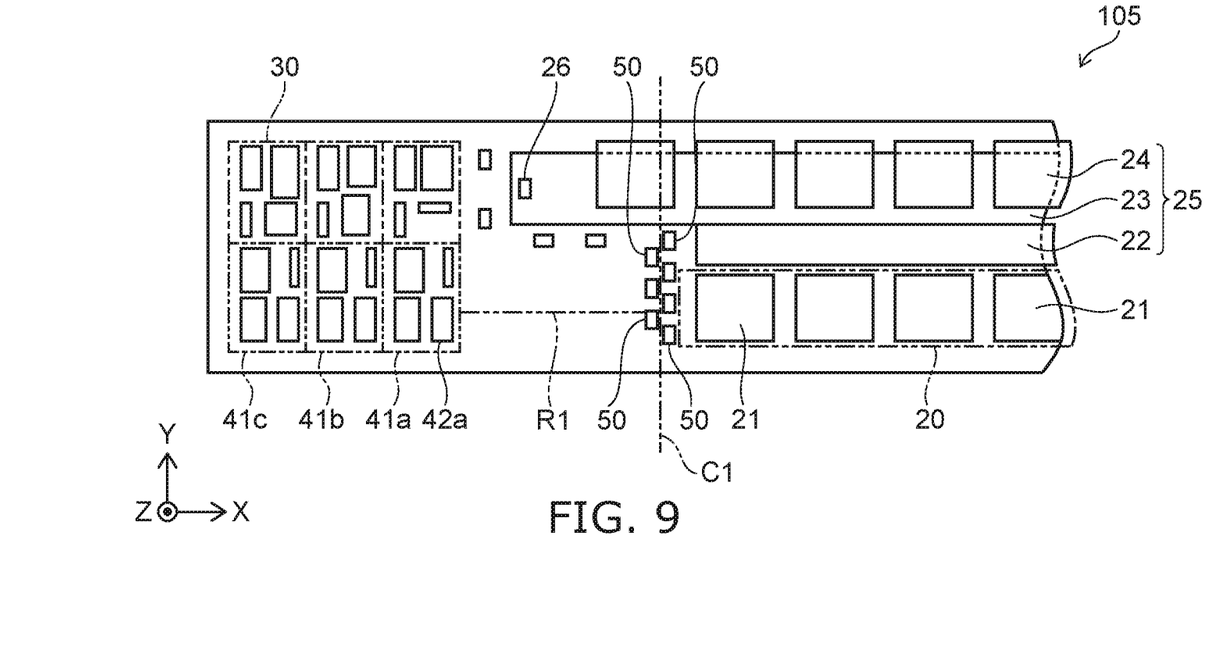
FIG. 9 is a cross sectional view showing a solid-state imaging device according to a fifth embodiment.

FIG. 9 is an enlarged plan view showing a solid-state imaging device 105 according to a fifth embodiment.

FIG. 9 describes arrangement of the metal members 50 in the XY plane, and omits showing the first interconnect 61 and the second interconnect 62.

In the embodiment, the multiple metal members 50 are arranged in a straight line extending in the Y-direction along the outer edge of the photodetection area 20 on the amplifier circuit 30 side and the outer edge of the readout gate electrode 22 on the amplifier circuit 30 side in a plan view. For example, the multiple metal members 50 are arranged side by side along the C1 line intersecting the line R1 connecting the photodetection area 20 and the light emitting transistor 42a emitting the most intense light included in the first amplifying element 41a with the shortest distance.

The shape of each metal member 50 is, for example, a quadrangular prism extending in the Z-direction. The multiple metal members 50 are arranged in two rows on both sides of the C1 line along the C1 line so as to sandwich and intersect the R1 line in a plan view, and are arranged in a staggered pattern. Since the metal members 50 of each row can be shifted on the C1 line to positions where the metal members 50 are not provided in other rows, the unnecessary light is easily blocked in the arrangement direction (Y-direction) of the metal members 50. The multiple metal members 50 may be arranged in three or more rows along the C1 line. Thereby, travel of the unnecessary light can be suppressed more effectively.

A First Modification of the Fifth Embodiment

Figure 10:
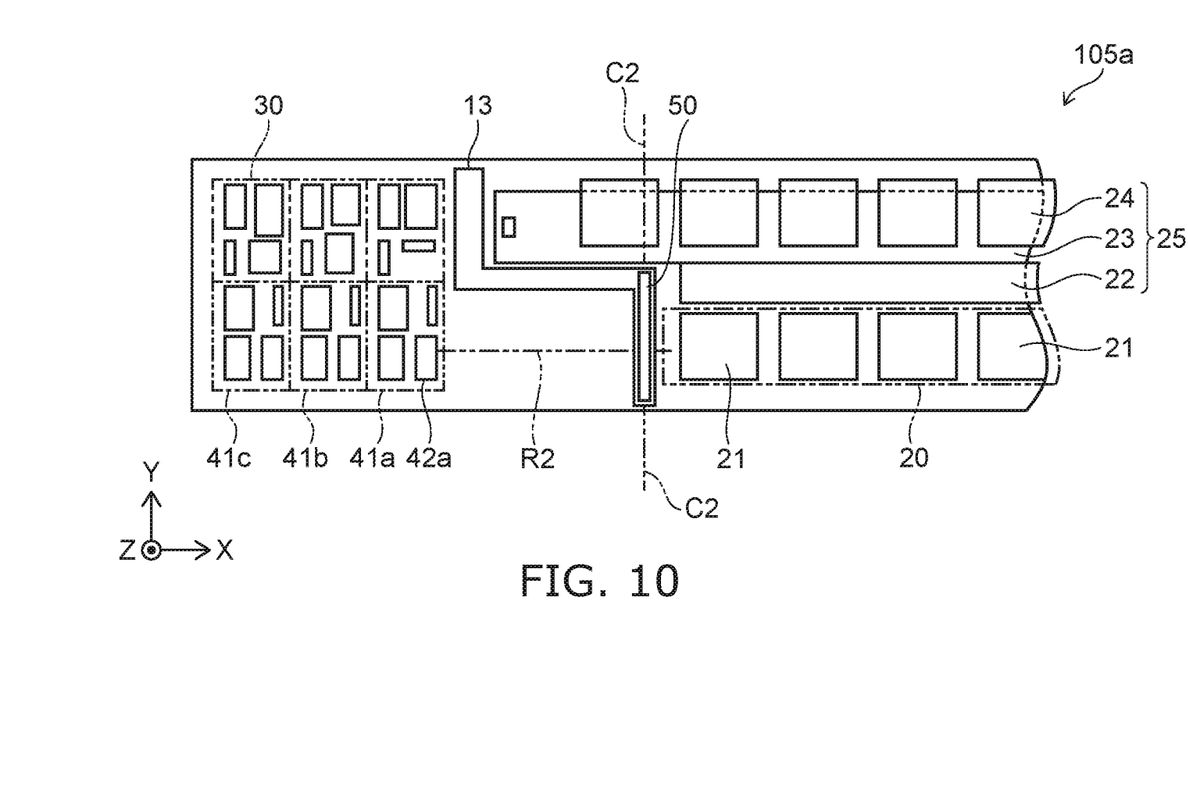
FIG. 10 is an enlarged plan view showing a solid-state imaging device according to a first modification of the fifth embodiment.

FIG. 10 is an enlarged plan view showing a solid-state imaging device 105a according to a first modification of the fifth embodiment. FIG. 10 illustrates the arrangement of the metal member 50 in the XY plane, and omits showing the first interconnect 61 and the second interconnect 62.

As shown in FIG. 10, in the solid-state imaging device 105a according to the modification, one metal member 50 is provided. The shape of the metal member 50 is a plate shape having the longest length in the Y-direction and a length in the Z-direction longer than the length in the X-direction. The metal member 50 extends in the Y-direction along the outer edge of the photodetection area 20 on the amplifier circuit 30 side and the outer edge of the readout gate electrode 22 on the amplifier circuit 30 side in a plan view.

The metal member 50 is provided along a C2 line that intersects a line R2 that connects the photodetection area 20 and the light emitting transistor 42a emitting the most intense light included in the first amplifying element 41a with the shortest distance. Thereby, a gap is not formed on the C2 line, and the unnecessary light 70 is easily blocked in the Y-direction.

A Second Modification of the Fifth Embodiment

Figure 11:
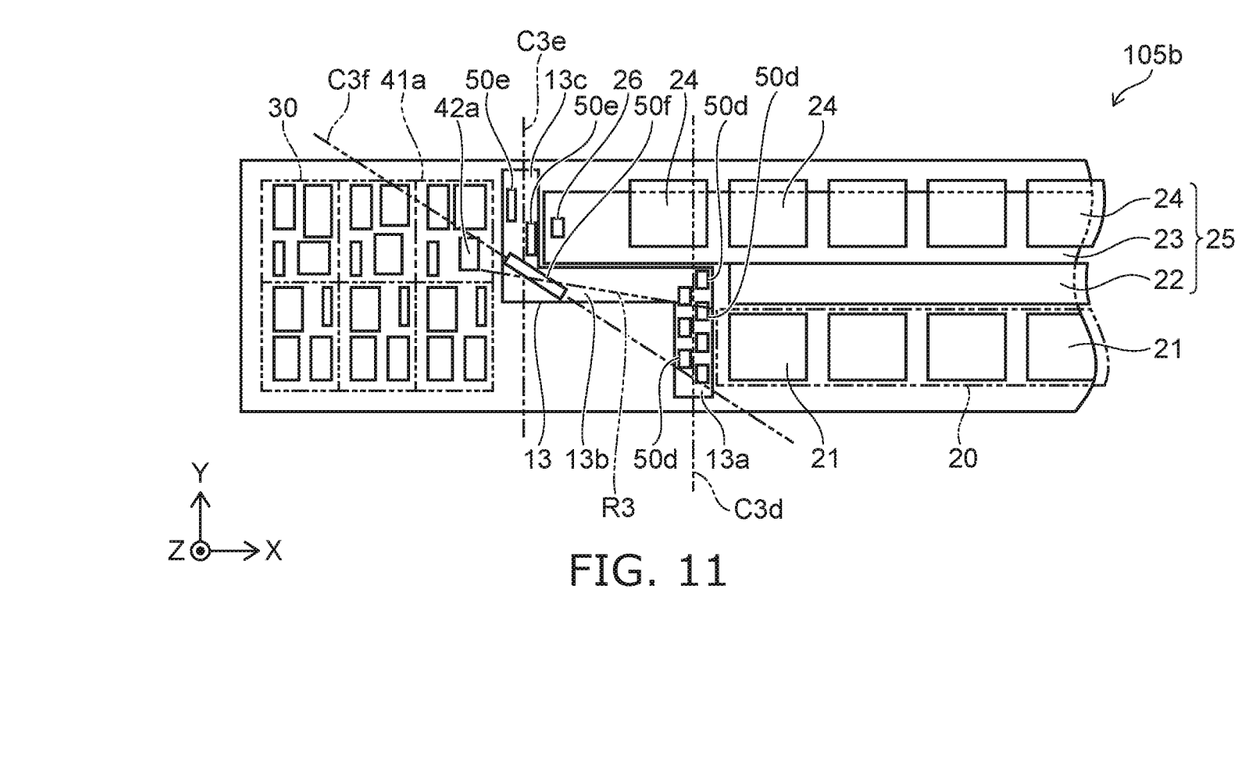
FIG. 11 is an enlarged plan view showing a solid-state imaging device according to a second modification of the fifth embodiment.

FIG. 11 is an enlarged plan view showing a solid-state imaging device 105b according to a second modification of the fifth embodiment. FIG. 11 illustrates the arrangement of the metal members 50d, 50e, 50f in the XY plane, and omits showing the first interconnect 61 and the second interconnect 62 is omitted.

As shown in FIG. 11, the solid-state imaging device 105b according to the modification is provided with metal members 50d, 50e, and 50f. In the solid-state imaging device 105b, the transistor 42a that emits the most intense light is disposed in the vicinity of the end of the impurity layer for transfer 23. A crank-shaped high concentration area 13 similar to that of the second embodiment is provided in the upper layer portion of the semiconductor layer 11. The multiple metal members 50d, 50e and 50f are provided on the high concentration area 13 in the insulating layer 12.

The metal member 50d is provided in a plurality. The multiple metal members 50d are arranged side by side along a C3d line that intersects a R3 line that connects the transistor 42a and the photodetection area 20 with the shortest distance in a plan view. The C3d line intersects the R3 line at a position close to the photodetection area 20 and extends in the Y-direction along the outer edge of the photodetection area 20 on the amplifier circuit 30 side. The C3d line passes through the center of the portion 13a extending along the Y-direction of the high concentration area 13. The multiple metal members 50d are arranged side by side along the C3d line across the intersection with the R3 line.

The multiple metal members 50d are provided in two rows along the C3d line, and arranged in a staggered pattern. The multiple metal members 50d have a cuboid shape in which the length in the Z-direction is longer than the length in the X-direction and the length in the Y-direction.

For example, two metal members 50e are provided. The two metal members 50e are arranged side by side along the C3e line that intersects the R3 line that connects the transistor 42a and the photodetection area 20 with the shortest distance in a plan view. The C3e line is a line that intersects with the R3 line at the end of the impurity layer for transfer 23 extending to the amplifier circuit 30 side on the photodetection area 20 side and is parallel to the Y-direction. The two metal members 50e are arranged along the C3e line, but shifted on both sides of the C3e line. The metal members 50e have a cuboid shape in which the length in the Y-direction and the length in the Z-direction are longer than the length in the X-direction.

For example, one metal member 50f is provided. The metal member 50f is disposed along the C3f line that intersects the R3 line that connects the transistor 42a and the photodetection area 20 with the shortest distance in a plan view. The C3f line intersects with the R3 line at the end of the impurity layer for transfer 23 extending to the amplifier circuit 30 side on the photodetection area 20 side, and is a line oblique to the right angle portion where a portion 13b and a portion 13c of the high concentration area 13 intersect. The shape of the metal member 50f is a plate shape, and is provided along the C5 line across the intersection with the R3 line. The metal member 50f extends obliquely at the right angle portion of the high concentration area 13 that surrounds one end of the charge transfer path 25.

Since the multiple metal members 50d are arranged in a staggered pattern along the outer edge of the photodetection area 20, the unnecessary light 70 is suppressed from entering the photodetection element 21. Since the metal members 50e and 50f are provided along the portion in the vicinity of the transistor 42a of the outer edge of the amplifier circuit 30, emission of the unnecessary light 70 generated in the transistor 42a is suppressed.

The metal members 50d, 50e, and 50f are provided on the semiconductor layer 11 in the insulating layer 12, but may be provided between the first interconnect 61 and the second interconnect 62, for example.

In addition, for the C3d line, the C3e line, and the C3f line, the intersection angle with the R3 line can be appropriately selected in consideration of the intensity and the reflection direction of the unnecessary light 70. Configurations, operations, and effects other than those described above in the embodiment are the same as those of the first embodiment.

Sixth Embodiment

Figure 12:
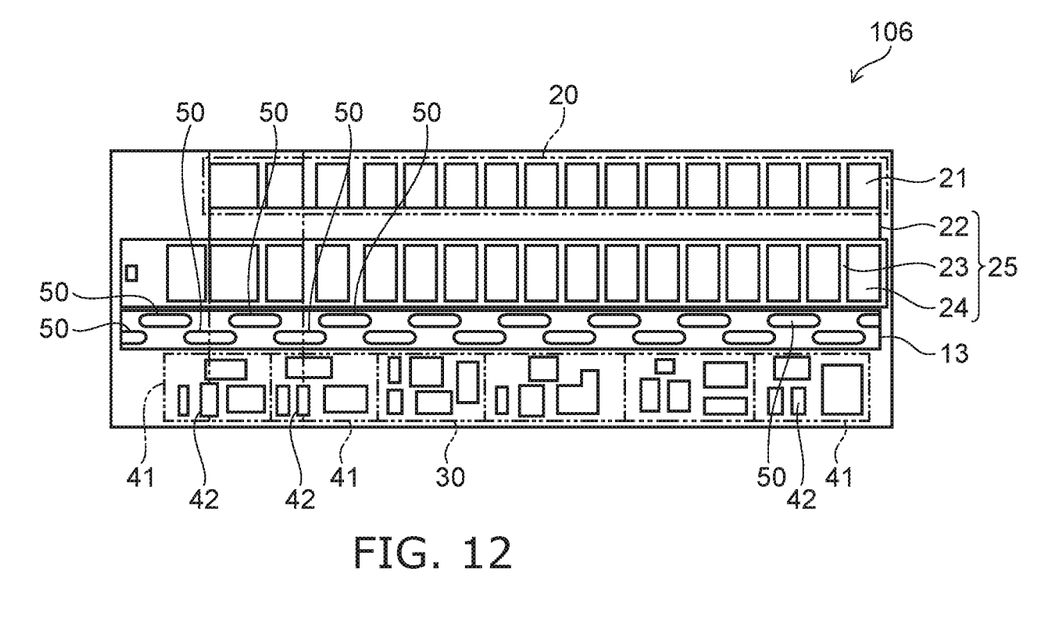
FIG. 12 is an enlarged plan view showing a solid-state imaging device according to a sixth embodiment.

FIG. 12 is an enlarged view showing a solid-state imaging device 106 according to a sixth embodiment, and omits the first interconnect 61 and the second interconnect 62.

As shown in FIG. 12, the soli-state imaging device 106 according to the embodiment is different in the arrangement of the photodetection area 20, the charge transfer path 25 and the amplifier circuit 30 compared with the solid-state imaging device 101 (see FIG. 1) according to the first embodiment. In the solid-state imaging device 106, the photodetection area 20, the charge transfer path 25, and the amplifier circuit 30 are arranged in this order along the Y-direction, and each extends in the X-direction.

The photodetection area 20 is provided on one side of the solid-state imaging device 106 in the Y-direction. In the photodetection area 20, multiple photodetection elements 21 are arranged in a line along the X-direction.

The charge transfer path 25 is provided inside the solid-state imaging device 106 from the photodetection area 20, and is provided along the X-direction in parallel with the photodetection area 20. In the charge transfer path 25, the band-shaped impurity layer for transfer 23 extending in the X-direction is provided. The readout gate electrode 22 is provided in the insulating layer 12 directly on the region between the photodetection area 20 and the impurity layer for transfer 23. In the insulating layer 12, the multiple gate electrodes for transfer 24 are arranged in a line along the X-direction in the region directly on the impurity layer for transfer 23, corresponding to the multiple photodetection elements 21.

The amplifier circuit 30 is isolated from the charge transfer path 25 in the Y-direction, and is provided on the other side of the solid-state imaging device 106 in the Y-direction. The amplifier circuit 30 is provided in parallel to the charge transfer path 25. In the amplifier circuit 30, multiple amplifying elements 41a, 41b, . . . , 41n are arranged in a line along the X-direction.

The high concentration area 13 is provided between the charge transfer path 25 and the amplifier circuit 30. The high concentration area 13 is provided in parallel to the charge transfer path 25. The high concentration area 13 is formed in a straight line shape along the X-direction as well in the photodetection area 20 in a plan view.

Multiple metal members 50 are provided on the high concentration area 13 in the insulating layer 12. The multiple metal members 50 are arranged in a staggered pattern in two rows along the Y-direction.

In the embodiment, since the photodetection area 20 is disposed over substantially the entire length of the solid-state imaging device 106 in the X-direction, when the multiple solid-state imaging devices 106 are assembled in the image capture unit, the area where the light is not detected can be reduced. Thereby, the optical system of the image capture unit can be simplified or omitted.

According to the embodiment, since the metal member 50 is disposed between the transistor 42 included in each amplifying element 41 of the amplifier circuit 30 and each photodetection element 21 in the photodetection area 20, it is possible to suppress the unnecessary light 70 generated in the transistor 42 from entering the photodetection element 21.

Configurations, operations, and effects other than those described above in the present embodiment are the same as those in the first embodiment.

Hereinabove, the embodiments of the invention are described with reference to specific examples. However, the embodiments of the invention are not limited to these specific examples. For example, one skilled in the art may similarly practice the invention by appropriately selecting specific configurations such as shapes, material, and arrangement of components included in solid-state imaging devices like metal members, interconnects, transistors, etc. from known art. Such practice is included in the scope of the invention to the extent that similar effects thereto are obtained. The material of the metal members and interconnects are not limited to tungsten, may be other metals, and may be different metals one another. Further, any two or more components of the specific examples may be combined within the extent of technical feasibility and are included in the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A solid-state imaging device, comprising:
a semiconductor layer;
an insulating layer provided on the semiconductor layer;
a plurality of photodetection elements provided in the semiconductor layer, and arranged in a line, the photodetection elements generating charges at light incidence;
a transistor provided in an amplifier circuit, the amplifier circuit being provided in the semiconductor layer and the insulating layer, being isolated from the photodetection elements, and amplifying electrical signals due to the charges; and
a metal member disposed between a photodetection area and the transistor in a plan view, the photodetection area being provided with the photodetection elements, wherein
all of the plurality of photodetection elements consist one row, and a photodetection element that does not consist the one row does not exist.

2. The device according to claim 1, wherein
the metal member is provided in the insulating layer and connected to the semiconductor layer.

3. The device according to claim 2, further comprising:
a first interconnect provided in the insulating layer,
the metal member is connected to the first interconnect.

4. The device according to claim 2, wherein
the semiconductor layer includes a high concentration area exposed to an upper surface of the semiconductor layer,
an impurity concentration of the high concentration area is higher than an impurity concentration of a portion in the semiconductor layer excluding the high concentration area, and
the metal member is connected to the high concentration area.

5. The device according to claim 1, wherein
at least a portion of the metal member is provided in the semiconductor layer.

6. The device according to claim 1, wherein
the semiconductor layer includes a high concentration area exposed to an upper surface of the semiconductor layer,
an impurity concentration of the high concentration area is higher than an impurity concentration of a portion in the semiconductor layer excluding the high concentration area, and
at least a portion of the metal member is disposed in the high concentration area.

7. The device according to claim 1, further comprising:
a first interconnect provided in the insulating layer; and
a second interconnect provided on the first interconnect in the insulating layer,
the metal member being provided between the first interconnect and the second interconnect, and connecting the first interconnect and the second interconnect.

8. The device according to claim 1, further comprising:
an impurity layer for transfer provided in the semiconductor layer, the impurity layer for transfer being isolated from the photodetection area and being provided along an arrangement direction of the photodetection elements;
a readout electrode provided in the insulating layer, the readout electrode being provided directly on a region between the photodetection area and the impurity layer for transfer; and
a plurality of gate electrodes for transfer provided in the insulating layer, the gate electrodes for transfer being provided on a region directly on the impurity layer for transfer and corresponding to the photodetection elements,
the photodetection area, the impurity layer for transfer, and the amplifier circuit being arranged along one direction, and
the metal member being disposed between the amplifier circuit and the impurity layer for transfer in a plan view.

9. A solid-state imaging device, comprising:
a semiconductor layer;
an insulating layer provided on the semiconductor layer;
a plurality of photodetection elements provided in the semiconductor layer, and arranged in a line, the photodetection elements generating charges at light incidence;
a transistor provided in an amplifier circuit, the amplifier circuit being provided in the semiconductor layer and the insulating layer, being isolated from the photodetection elements, and amplifying electrical signals due to the charges;
a metal member disposed between a photodetection area and the transistor in a plan view, the photodetection area being provided with the photodetection elements;
an impurity layer for transfer provided in the semiconductor layer, the impurity layer for transfer being isolated from the photodetection area and being provided along an arrangement direction of the photodetection elements;
a readout electrode provided in the insulating layer, the readout electrode being provided directly on a region between the photodetection area and the impurity layer for transfer; and
a plurality of gate electrodes for transfer provided in the insulating layer,
the gate electrodes for transfer being provided on a region directly on the impurity layer for transfer and corresponding to the photodetection elements,
a direction from the photodetection area toward the impurity layer for transfer crossing a direction from the photodetection area toward the amplifier circuit,
a distance between the impurity layer for transfer and the amplifier circuit being shorter than a distance between the photodetection area and the amplifier circuit, and the metal member being disposed also between the impurity layer for transfer and the amplifier circuit in a plan view.

* * * * *